(12) United States Patent
Kamada

(10) Patent No.: US 6,647,530 B1
(45) Date of Patent: Nov. 11, 2003

(54) APPARATUS AND METHOD FOR VITERBI DECODING

(75) Inventor: Takehiro Kamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/719,434

(22) PCT Filed: Apr. 12, 2000

(86) PCT No.: PCT/JP00/02385

§ 371 (c)(1),
(2), (4) Date: Dec. 12, 2000

(87) PCT Pub. No.: WO00/62427

PCT Pub. Date: Oct. 19, 2000

(30) Foreign Application Priority Data

Apr. 12, 1999 (JP) .......................... 11-103592

(51) Int. Cl.[7] .................. H03M 13/41; H03M 13/25
(52) U.S. Cl. .................. 714/792; 714/795; 714/796
(58) Field of Search .......................... 704/242; 375/262, 375/265; 714/795, 792, 796

(56) References Cited

U.S. PATENT DOCUMENTS

| | | | | |
|---|---|---|---|---|
| 5,982,822 A | * | 11/1999 | Hatakeyama | 714/795 |
| 6,041,433 A | * | 3/2000 | Kamada | 714/795 |
| 6,504,882 B1 | * | 1/2003 | Kim | 714/795 |
| 6,553,541 B1 | * | 4/2003 | Nikolic et al. | 714/795 |

FOREIGN PATENT DOCUMENTS

| | | | | |
|---|---|---|---|---|
| JP | 8-46524 | 2/1996 | | |
| JP | 08046524 A | * 2/1996 | .......... | H03M/13/12 |
| JP | 09191258 A | * 7/1997 | .......... | H03M/13/12 |
| JP | 9-232972 | 9/1997 | | |
| JP | 09232972 A | * 9/1997 | .......... | H03M/13/12 |
| JP | 10-215190 | 8/1998 | | |
| JP | 10215190 A | * 8/1998 | .......... | H03M/13/12 |

OTHER PUBLICATIONS

Garrett et al., Low Power Architecture of the Soft–Output Viterbi Algorithm, 1998, ACM Press, New York, Proceedings of the 1998 International Symposium on Low Power Electronics and Design, pp. 262–267.*

Parhi, ed. "Digital Signal Processing for Multimedia Systems" (Jul. 1999) pp. 424–425.

* cited by examiner

Primary Examiner—R. Stephen Dildine
(74) Attorney, Agent, or Firm—McDermott, Will & Emery

(57) ABSTRACT

The path temporary storage unit 101 stores path select signals outputted from the ACS means 100 over a certain period of time. The partial trace back unit 102 performs a partial trace back between the first time point and the second time point by using the path select signals stored in the path temporary storage unit 101, and detects a non-passing node through which surviving paths do not pass at the second time point. The conversion unit 103 receives the signals from the partial trace back unit 102, and converts the path select signal corresponding to the non-passing node into a predetermined fixed value. This decreases the probability of occurrence of a signal transition in the path memory 104, thereby reducing power consumption.

17 Claims, 15 Drawing Sheets

US 6,647,530 B1

APPARATUS AND METHOD FOR VITERBI DECODING

TECHNICAL FIELD

The present invention relates to viterbi decoding for decoding convolutional codes, and more specifically, to a technique for reducing power consumption in path storage means.

BACKGROUND ART

Viterbi decoding is used in the maximum likelihood decoding of convolutional codes. Because of its high ability to correct errors, viterbi decoding is used in decoders of a transmission system such as satellite communications and satellite broadcasting, which tend to cause transmission errors.

In recent years, as demodulating circuits have become faster and had larger packing densities, viterbi decoders, which are smaller in circuit size, lower in power consumption and operative at higher speed have been presented (Refer to Japanese Patent Publication No. 2996615 for example).

In addition, in viterbi decoding, there has been a conventional technique for reducing power consumption in the path memory. FIG. 16 shows a conventional viterbi decoder with a structure to reduce power consumption in the path memory (disclosed in Japanese Laid-Open Patent Application No. 8-46524). To simplify the explanation, this drawing indicates the case where the encoding rate is ½ and the constraint length (the number of shift registers contained in a convolutional encoder+1) K=3.

In FIG. 16, an ACS (Add Compare Select) circuit 700 generates path select signals from reception codes entered therein. A majority circuit 701 outputs "0" when there are more "0"s than "1"s in the 4-bit path select signals outputted from the ACS circuit 700, and outputs "1" when there are more "1"s than "0"s. A first conversion unit 702 includes means 702a to 702d each for generating an XOR of an output of the ACS circuit 700 and the corresponding output of the majority circuit 701. Receiving "1" as the output of the majority circuit 701, the means 702a to 702d reverse the path select signals received from the ACS circuit 700. The outputs of the majority circuit 701 are also stored in a storage delay unit 703.

The storage delay unit 703 delays the outputs of the majority circuit 701 by the length of the delay in decoding, and outputs them at the same timing as the corresponding path select signals are outputted from the path memory 704. A second conversion unit 705 includes means 705a to 705d each for generating an XOR of an output of the path memory 704 and the corresponding output of the storage delay unit 703. When the output of the storage delay unit 703 is "1", the means 705a to 705d reverse the path select signals outputted from the path memory 704 so as to return the path select signals to their original states.

Through these operations, the path select signals stored in the path memory 704 are supposed to have more logical value "0"s than "1"s. Consequently, the signal transition in the path memory 704 occurs less frequent so as to reduce power consumption, thereby achieving a viterbi decoder operative with lower power consumption.

PROBLEMS TO BE SOLVED

However, the above-mentioned conventional structure requires a majority circuit, a storage delay unit and conversion units as add-on circuits for an intrinsic viterbi decoder. This undesirably increases the circuit size, thereby boosting the power consumption in the large add-on circuits when the constraint length becomes large or when a delay in decoding is extended in order to improve the ability to correct errors.

Moreover, a majority circuit usually operates slower as the number of target bits increases, so that the above-mentioned conventional structure is not suitable for a viterbi decoder, which requires high-speed operations.

DISCLOSURE OF THE INVENTION

The present invention has an object of reducing power consumption in the path storage means for storing path select signals in viterbi decoding in a different manner from conventional methods.

To be more specific, the present invention relates to a viterbi decoder and a viterbi decoding method for performing decoding by using path storage means for storing path select signals, performing the steps of: partially tracing back path select signals outputted from ACS means between a first time point and a second time point, thereby finding surviving paths reaching each node at the first time point; detecting a non-passing node through which said surviving paths do not pass, of nodes at the second time point; converting a path select signal corresponding to said non-passing node at the second time point in such a manner as to decrease a probability of occurrence of a signal transition in said path storage means; and storing path select signals corresponding to said nodes at the second time point to said path storage means.

According to the present invention, a path select signal which is never referred to in a trace back for decoding and which corresponds to a non-passing node is so converted as to decrease the probability of occurrence of a signal transition in the path storage means. The decrease in the probability of occurrence of a signal transition in the path storage means results in a reduction in power consumption.

In the viterbi decoder and viterbi decoding method, it is preferable that said path select signal corresponding to said non-passing node is converted into a predetermined fixed value which is one of signal values of said path select signal. Consequently, the path storage means statistically contains the logical value corresponding to the predetermined fixed value more than the other logical value, thereby making the dispersion of logical value uneven. As a result, the probability of occurrence of a signal transition in the path storage means becomes lower than in the case where no conversion is performed, thereby restricting power consumption in the path storage means.

In the viterbi decoder and viterbi decoding method, it is preferable that said path select signal corresponding to said non-passing node is converted into a same value as a value already stored in a storage region in said path storage means where said path select signal to be converted is supposed to be written. Consequently, the probability of occurrence of a signal transition in the path storage means becomes lower than in the case where no conversion is performed, thereby restricting power consumption in the path storage means.

The present invention also relates to a viterbi decoder which has path storage means for storing path select signals and which performs decoding by using said path storage means, said viterbi decoder comprising: a path temporary storage unit for storing path select signals outputted from ACS means over a certain period of time and then outputting said path select signals; a partial trace back unit for tracing back surviving paths reaching each node at time t+p by using path select signals between time t and time t+p−1 where p is a natural number which are stored in said path temporary storage unit and path select signals at time t+p outputted from said ACS means so as to detect a non-passing node through which said surviving paths do not pass; and a conversion unit for inputting path select signals at time t outputted from said path temporary storage unit, and receiving signals from said partial trace back unit so as to convert a path select signal corresponding to said non-passing node out of said path select signals at time t into a predetermined fixed value which is one of signal values of said path select signal, said path storage means storing path select signals at time t outputted from said conversion unit.

Alternatively, the present invention relates to a viterbi decoder which has path storage means f or storing path select signals and which perform decoding by using said path storage means, said viterbi decoder comprising: a path temporary storage unit for storing path select signals outputted from ACS means over a certain period of time and then outputting said path select signals; a partial trace back unit for tracing back surviving paths reaching each node at time t+p by using path select signals between time t and time t+p−1 where p is a natural number which are stored in said path temporary storage unit and path select signals at time t+p outputted from said ACS means so as to detect a non-passing node through which said surviving paths do not pass; readout means for reading out storage contents in a storage region in said path storage means where path select signals at time t are supposed to be written; and a conversion unit for inputting said path select signals at time t outputted from said path temporary storage unit and said storage contents outputted from said readout means and receiving signals from said partial trace back unit so as to convert a path select signal corresponding to said non-passing node out of said path select signals at time t into a same value as a value which is contained in said storage contents and stored in a storage region where said path select signal to be converted is supposed to be written, said path storage means storing path select signals at time t outputted from said conversion unit.

It is preferable that said partial trace back unit finds a function g (t, j) concerning each node j at time t, and determines that node j is a non-passing node when g (t, j)=0, where g (t, i) is a function for calculating g (r, i)=Σ{g (r+1, n (i))×f (r, n (i))} from r=t+p−1 until r=t in sequence by using g (t+p, k)=1 as an initial value where k is an any node number, where n (i): transition target nodes at time r+1 of a node i at time r;

f (r, n (i)): a function which indicates whether or not surviving paths reaching nodes n (i) at time r+1 pass through node i at time r, and which becomes "1" when said surviving paths pass through said nodes i, "0" otherwise;

Σ{ }: an OR of all said nodes n (i); and

×: AND.

This indicates that the partial trace back unit is realized by a small-sized circuit, based on the nature of calculation. In other words, according to the present invention, detection of a non-passing node is executed by repetitive calculations of simple ANDs and ORs, making it possible to construct the partial trace back unit by a small-sized calculator.

It is further preferable that said partial trace back unit comprises a plurality of storage means for storing each value of g (r, i) at time r, and performs calculation of said function g (t, j) by pipeline processing. Consequently, the calculation of g (t, j) can be executed by being divided into a plurality of cycles. As a result, the amount of calculation per cycle can be lessened, thereby realizing a high-speed detection of a non-passing node.

The present invention further relates to a viterbi decoder and a viterbi decoding method for per-forming decoding by using path storage means, performing the steps of: applying predetermined conversion to path select signals outputted from ACS means; storing converted path select signals in said path storage means; applying conversion reverse to said predetermined conversion to path select signals outputted from said path storage means; and performing decoding by using reversely-converted path select signals, said predetermined conversion being so conducted that, out of combinations of path select signals representing surviving paths in a predetermined portion in a trellis diagram, a first combination with a relatively high frequency of occurrence contains a predetermined fixed value which is one of signal values of said path select signals more than a second combination with a relatively low frequency of occurrence.

According to the present invention, before being stored in the path storage means, the path select signals outputted from the ACS means are so converted that the combination with a relatively high frequency of occurrence has the predetermined fixed value which is one of the signal values of the path select signals more than the combination with a relatively low frequency of occurrence. Consequently, the path storage means statistically contains the logical value corresponding to the predetermined fixed value more than the other value, thereby making the dispersion of logical value uneven. As a result, the probability of occurrence of a signal transition in the path storage means becomes lower than in the case where no conversion is performed, thereby restricting power consumption in the path storage means.

It is preferable that said predetermined conversion is performed by using a combination of path select signals with a relatively few number of merges of surviving paths as the first combination, and a combination of path select signals with a relatively large number of merges of surviving paths as the second combination.

BRIEF DESCRIPTION OF THE DRAWINGS

FIG. 3A shows a part of the trellis diagram between time t and time t+1, and FIGS. 3B to 3E respectively show the surviving paths in the trellis diagram of FIG. 3A.

FIG. 7A shows a part of the trellis diagram between time t and time t+2, FIG. 7B shows a logic circuit which generates mask signals that is structured in accordance with the partial trellis of FIG. 7A, and FIG. 7C shows the paths related to the node j at time t in the partial trellis of FIG. 7A.

BEST MODE FOR CARRYING OUT THE INVENTION

The embodiments of the present invention will be described as follows with reference to the drawings. In the following description, a node having a node number j (j is either 0 or a positive integer) in the trellis diagram will be referred to as a node j.

EMBODIMENT 1

Figure 1:
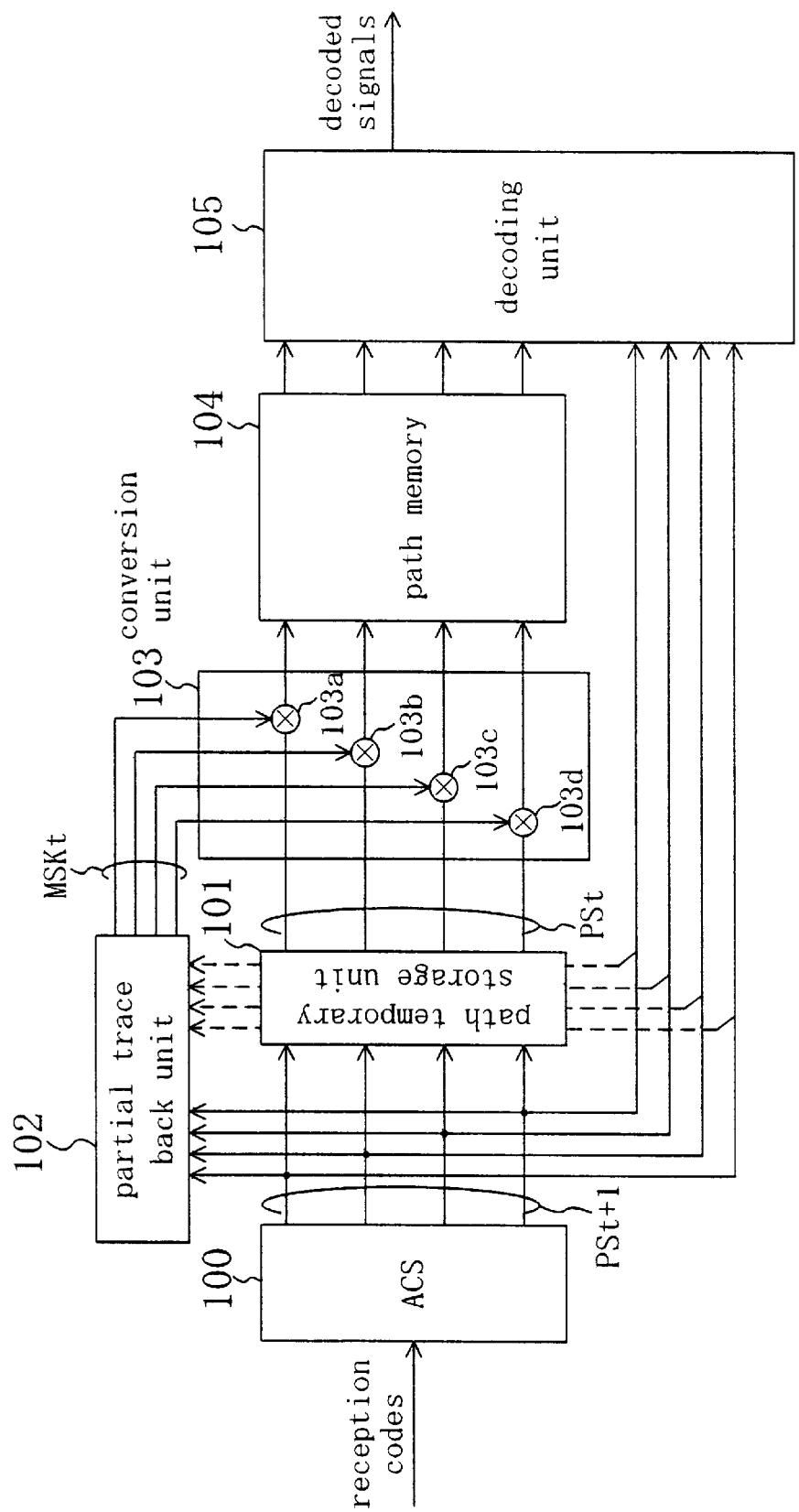
FIG. 1 shows the structure of the viterbi decoder of the first embodiment of the present invention.

FIG. 1 shows the rough structure of the viterbi decoder of the first embodiment of the present invention. In order to simplify the explanation, the following description will show the case where the encoding rate is ½ and the constraint length K=3. Furthermore, "j" is expressed in J=2*s0+ s1 by 2-bit data s0 and s1 stored in a shift resister indicating the state of the encoder.

In FIG. 1, the viterbi decoder comprises an ACS circuit 100 as ACS (Add Compare Select) means for generating path select signals from reception codes, a path temporary storage unit 101 which stores path select signals outputted from the ACS circuit 100 over a predetermined period of time and then outputs them, and a partial trace back unit 102 which traces back surviving paths reaching each node at time t+p by using the path select signals of between time t and time t+p−1 (p is a natural number) stored in the path temporary storage unit 101 and the path select signals at time t+p outputted from the ACS circuit 100, and detects a non-passing node, through which the surviving paths do not pass, from among the nodes at time t.

Here, assume that p=1. In other words, the path temporary storage unit 101 stores-path select signals for one time point. The partial trace back unit 102 outputs, as a mask signal MSKt, "0" for the path select signal corresponding to the non-passing node, of the path select signals PSt at time t outputted from the path temporary storage unit 101, and further outputs "1" for the path select signal corresponding to the node other than the non-passing node, or to the node through which the surviving path passes.

The viterbi decoder further comprises a conversion unit 103 which inputs the path select signals PSt from the path temporary storage unit 101 and receives the mask signals MSKt from the partial trace back unit 102 so as to convert, of, the path select signals PSt, the path select signal corresponding to the non-passing node into the logical value "0" as the predetermined fixed value. The conversion unit 103 includes AND generation means 103a to 103d for generating and outputting the AND of each bit of the path select signals PSt outputted from the path temporary storage unit 101 and the corresponding bit of the mask signals MSKt, respectively.

The viterbi decoder further comprises a path memory 104 as path storage means for storing the path select signals outputted from the conversion unit 103 and a decoding unit 105 for generating and outputting decoded signals by tracing back the path select signals stored in the path memory 104.

Figure 2:
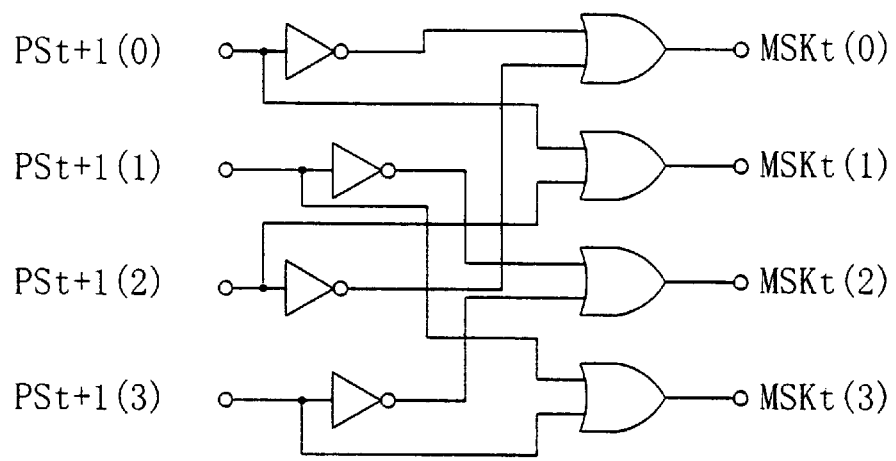
FIG. 2 shows the internal structure of the partial trace back unit of FIG. 1.

FIG. 2 shows the internal structure of the partial trace back unit 102 of FIG. 1. As shown in the structure, the partial trace back unit 102 receives the path select signals PSt+1 at time t+1 and in turn outputs the mask signals MSKt for the path select signals PSt at time t.

The behavior of the viterbi decoder thus structured will be described as follows with reference to FIGS. 3A to 3E.

Figure 3A:
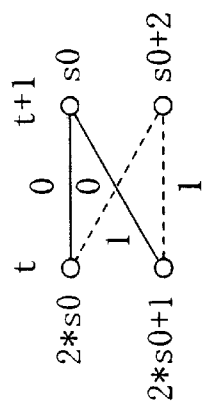
FIGS. 3A to 3E show the behavior of the viterbi decoder of FIG. 1.
Figure 3E:
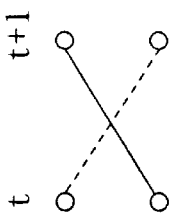
Figure 3D:
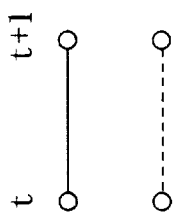

FIG. 3A shows the partial trellis which is a part of the trellis diagram between time t and time t+1. By giving "0" and "1" to the data s0, the trellis diagram between time t and time t+1 of the present embodiment is obtained. As shown in FIG. 3A, the ACS circuit 100 outputs "0"s as the path select signals PSt+1 when it selects a transition from the node 2*s0 at time t, and outputs "1"s when it selects a transition from the node 2*s0+1 for the nodes s0 and s0+2 at time t+1 from the reception signals at time t+1.

In this case, the possible combinations of the surviving paths between time t and time t+1 are shown in FIGS. 3B to 3E. In FIGS. 3B to 3E, the path select signals PSt+1 (s0) and PSt+1 (s0+2) for the nodes so and s0+2 at time t+1 become (0, 0), (1, 1), (0, 1), and (1, 0), respectively.

Figure 3C:
Figure 3B:

It must be noted that when the surviving paths merge with each other as in FIGS. 3B and 3C, no path passes through the node 2*s0+1 in FIG. 3B or the node 2*s0 in FIG. 3C at time t in tracing back from time t+1. Thus, in tracing further back from time t, path select signals corresponding to these nodes are never referred to. In other words, whatever value the value of the path select signal corresponding to non-passing node through which no surviving path passes may be converted into, it does not badly affect the decoding operation. The present invention has been contrived based on these findings.

To be more specific, detecting the state shown in either FIG. 3B or FIG. 3C from the path select signals PSt+1 at time t+1, the partial trace back unit 102 generates "0" as a mask signal MSKt for the path select signal corresponding to the non-passing node through which the surviving paths do not pass, and further generates "1"s as the mask signals MSKt for the other path select signals out of the path select signals PSt at time t stored in the path temporary storage unit 101.

For example, assume that the data s0=0, the state of FIG. 3B will be:

$$PSt+1(0)=0, PSt+1(2)=0 \qquad (1)$$

In this case, the non-passing node is node 1. In the structure of FIG. 2, under conditions of Formula (1), only MSKt (1) becomes "0". The state of FIG. 3C will be:

$$PSt+1(0)=1, PSt+1(2)=1 \qquad (2)$$

In this case, the non-passing node is node 0. In the structure of FIG. 2, under conditions of Formula (2), only MSKt (0) becomes "0".

The conversion unit 103 makes the AND generation means 103a to 103d AND the path select signal corresponding to the non-passing node with the mask signal MSKt or "0" so as to convert the path select signal corresponding to the non-passing node into "0". The path select signals corresponding to the nodes other than the non-passing node are not converted because the mask signals MSKt are "1"s.

The path memory 104 stores the outputs of the conversion unit 103. The decoding unit 105 performs tracing back in the traditional manner using the path select signals stored in the path memory 104 so as to decode these signals.

Through the above-mentioned structure and behavior, the path select signal corresponding to the non-passing node is converted into 0 and stored in the path memory 104, so that the values of the path select signals stored in the path memory 104 statistically have more "0"s than "1"s. As a result, the probability of occurrence of a signal transition in the memory cell or memory output of the path memory 104 becomes lower than ½. This reduces power consumption in the path memory 104, thereby realizing a viterbi decoder operative with low power consumption.

Unlike the conventional structure, the decoder of the present embodiment has the partial trace back unit 102 smaller in size than the majority circuit 701, so that its add-on circuits can be far smaller in size than the conventional ones and does not need the storage delay unit 703 or the second conversion unit 705.

In the structure shown in FIG. 1, the path select signals that have not been converted yet are used for decoding because if converted path select signals were set at the start of tracing back, it might cause the wrong path to be traced back.

The above description shows the case where the encoding rate is ½, the constraint length K=3, and p=1; however, in general when the encoding rate is m/n (n and m are positive integers), the partial trellis can be extended from between. 2 states shown in FIG. 3A to between $2^m$ states. This makes it possible to trace back the surviving paths from each state at time t+1, and to covert the path select signals corresponding to the states at time t when not a single surviving path passes through to "0"s. As a result, the same effects as the present embodiment can be obtained.

<Generalization of Partial Trace Back>

The convolutional codes having an encoding rate of m/n on Galois field (q) (q is a prime number, and m and n are natural numbers) are characterized by the trellis diagram having the state transition of the encoder extended in the direction of time.

Figure 4:
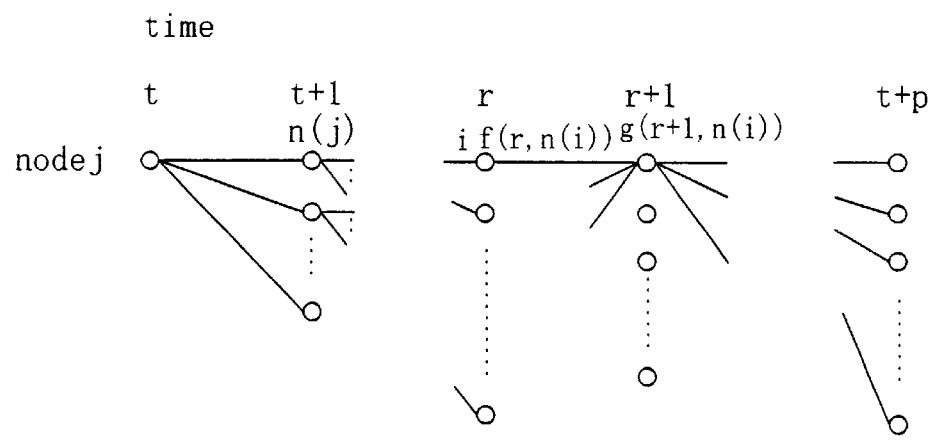
FIG. 4 is a simplified trellis diagram starting from a node j at time t to time t+p.

FIG. 4 shows a simplified trellis diagram starting from a node j at time t to time t+p. There are $q^m$ paths which make a transition from a node i at time r to the next time point r+1, and there are also $q^m$ transition target nodes n (i). With respect to these transition target nodes n (i), a function f (r, n (i)) is defined as follows. When surviving paths reaching the nodes n (i) at time r+1 pass through the node i at time r, the following equation holds:

$f(r, n(i))=1.$

On the other hand, when the surviving paths pass through a node other than the node i, the following equation holds:

$f(r, n(i))=0.$

With respect to the nodes n (i) at time r+1, a function g (r+1, n (i)) is defined as follows. When at least one of the surviving paths from time t+p passes through the nodes n (i), the following equation holds:

$g(r+1, n(i))=1.$

When not a single surviving path passes through the nodes n (i), the following equation holds:

$g(r+1, n(i))=0.$

If the value of g (t+p, k) for all the nodes at time t+p is "1", then g (r, i) can be easily found by calculating Formula (3) below from time t+p to time r in sequence:

$$g(r, i)=\Sigma\{g(r+1, n(i))\times f(r, n(i))\} \quad (3)$$

where $\Sigma\{\cdot\}$ indicates the OR of $\{\cdot\}$ concerning all of the $q^m$ nodes n (i), and X indicates the AND of the same.

Consequently, g (t, j) becomes "1" when at least one of the surviving paths at time t+p passes through the node j at time t, "0" otherwise. As a result, a node j which makes g (t, j)=1 becomes a passing node, and a node j which makes g (t, j)=0 becomes a non-passing node.

Thus, the partial trace back unit can determine that a node j becomes a non-passing node when g (t, j)=0 through a calculation of g (r, i) in Formula (3) from r=t+p−1 to r=t in sequence by using g (t+p, k)=1 (k can be any node number) as the initial value. The value of g (t, j) can be used as the mask signals MSKt (j).

In the above example, since m=1, p=1 and the constraint length K=3 makes the number of states 4 (=$2^{(3-1)}$), the trellis diagram treated by the partial trace back unit 102 can be divided into partial trellis between 2 states as shown in FIG. 3A.

Furthermore, p=1 leads to g (t+1, k)=1, and Formula (3) becomes a simple OR of f (t, n (i)). In this case, f (t, n (2*s0)) is equal to the logical inverse of the path select signals PSt+1 (s0) and PSt+1 (s0+2) at time t+1, and f (t, n (2*s0+1)) becomes equal to the path select signals PSt+1 (s0) and PSt+1 (s0+2) at time t+1. To be more specific, $$g(t, 2*s0) = \sum \{f(t, n(2*s0))\}$$
$$= !PSt+1(s0) + !PSt+1(s0+2)$$
$$g(t, 2*s0+1) = \sum \{f(t, n(2*s0+1))\}$$
$$= PSt+1(s0) + PSt+1(s0+2)$$

where ! represents logical inverse.

Figure 5:
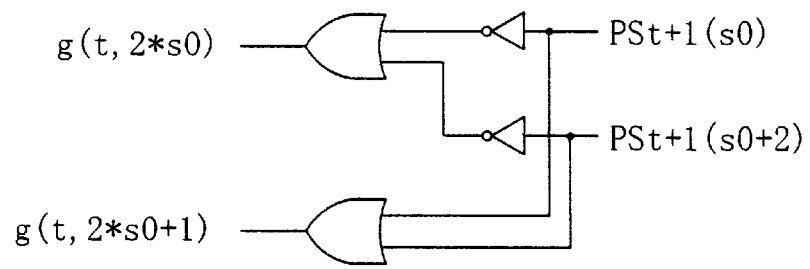
FIG. 5 shows the logic circuit which generates mask signals that is structured in accordance with the partial trellis of FIG. 3A.

Consequently, the partial trace back unit 102 can be composed of the logical circuit shown in FIG. 5. The partial trace back unit 102 shown in FIG. 2 can be obtained by providing the logical circuit of FIG. 5 with s0="0" and "1".

The same holds true when p is 2 or larger. In that case, the path temporary storage unit 101 stores p sets of path select signals between time t and time t+p−1. In order to determine a non-passing node, the partial trace back unit 102 needs to receive path select signals of $q^{(k-1)} \cdot m \cdot (p-1)$ bits (q states per bit) where $q^{(k-1)}$ is equal to the number of states the encoder can take.

<When p=2>

In order to simplify the explanation, the following description will show the case where the encoding rate is ½, the constraint length K=3, p=2, and q=2.

Figure 6:
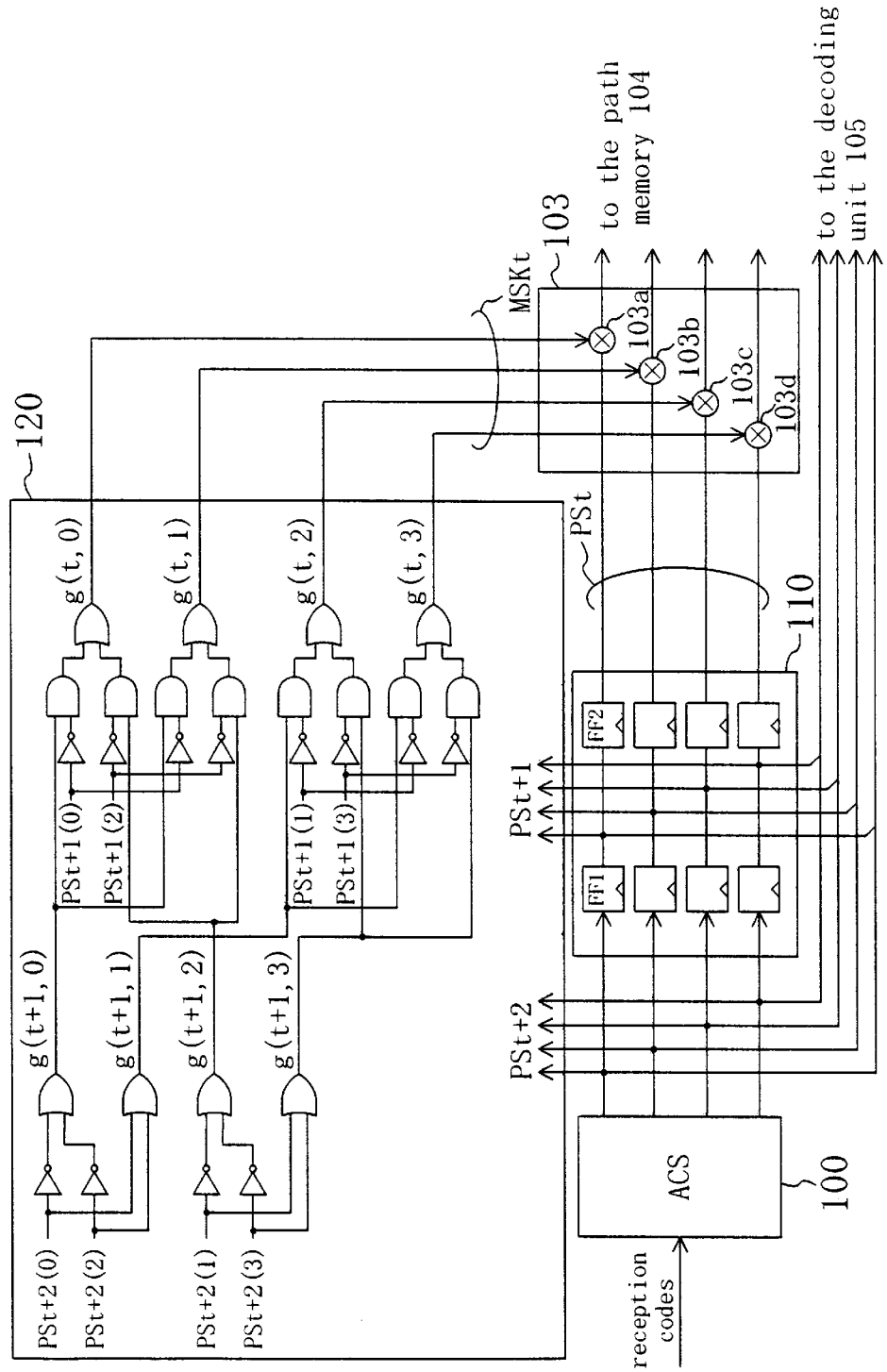
FIG. 6 shows the structure of the viterbi decoder of the first embodiment of the present invention in the case where p=2.

FIG. 6 shows the entire structure of the viterbi decoder of the present embodiment where p=2. Its fundamental structure is the same as the case of p=1, so that the structural elements operating the same manner as the case of p=1 will not be described in detail.

Since it is composed of a shift register and p=2, the path temporary storage unit 110 stores path select signals at time t and time t+1. The partial trace back unit 120 receives the path select signals PSt+1 at time t+1 stored in the path temporary storage unit 110 and the path select signals PSt+2 at time t+2 outputted from the ACS circuit 100, and calculates and outputs the mask signals MSKt for the conversion of the path select signals PSt at time t. The conversion unit 103 converts the path select signals PSt at time t outputted from the path temporary storage unit 110 by using the mask signals MSKt outputted from the partial trace back unit 120 and stores the converted signals in the path memory 104.

By referring to FIGS. 7A to 7C, the detailed structure and principle of operation of the partial trace back unit 120 shown in FIG. 6 will be described as follows.

Figure 7A:
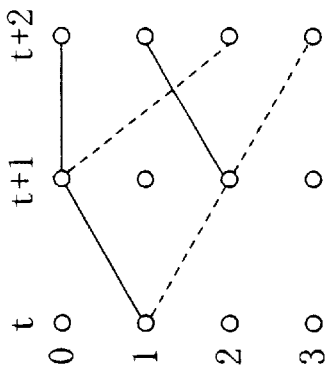
FIGS. 7A to 7C are diagrams explaining the structure and principle of operation of the partial trace back of FIG. 6.
Figure 7C:
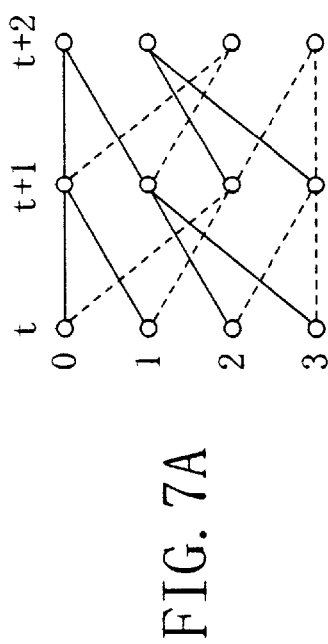
Figure 7B:
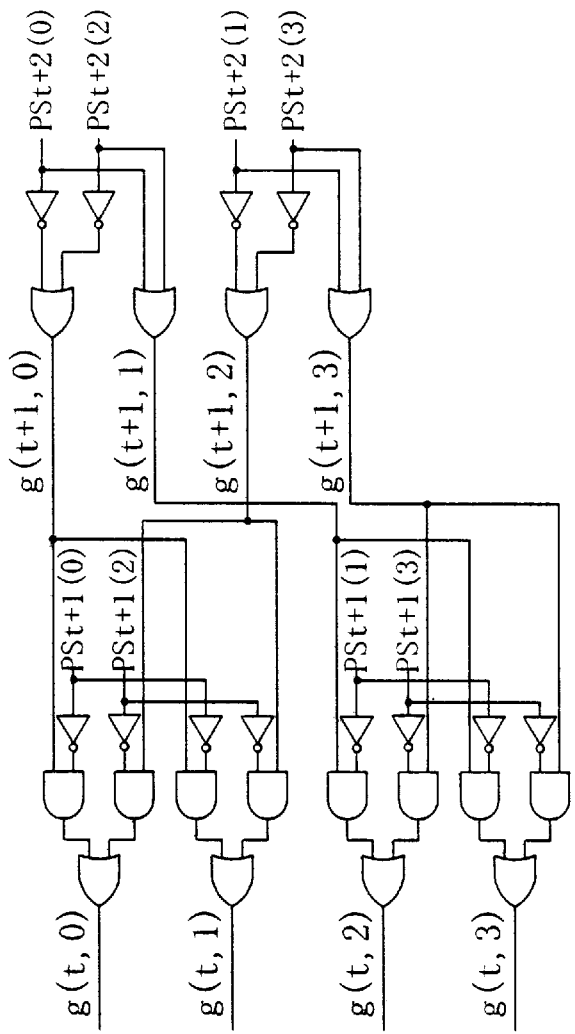

The trellis diagram between time t and time t+2 appears as shown in FIG. 7A. The nodes n (i) which make a transition from the node i are as follows:

n (0)={0, 2}
n (1)={0, 2}
n (2)={1, 3}
n (3)={1, 3}

Since the ACS circuit 100 operates the same manner as the case of p=1, f (r, n (i)) of each node i at time r becomes as follows by using the path select signals PSr+1 (n (i)) at time r+1:

f (r, n (0))=!PSr+1 (n (0))
f (r, n (1))=PSr+1 (n (1))
f (r, n (2))=!PSr+1 (n (2))
f (r, n (3))=PSr+1 (n (3))

where ! represents logical inverse.

From Formula (3), if the initial value g (t+2, k)=1 (k=0, 1, 2, 3), then, $$g(t+1, 0) = \sum \{g(t+2, n(0)) \times f(t+1, n(0))\}$$
$$= g(t+2, 0) \times (! PSt+2(0)) +$$
$$g(t+2, 2) \times (! PSt+2(2))$$
$$= ! PSt+2(0) + ! PSt+2(2)$$

Similarly,
g (t+1, 1)=PSt+2 (0)+PSt+2 (2)
g (t+1, 2)=!PSt+2 (1)+!PSt+2 (3)
g (t+1, 3)=PSt+2 (1)+PSt+2 (3)
As a result, $$g(t, 0) = \sum \{g(t+1, n(0)) \times f(t, n(0))\}$$
$$= g(t+1, 0) \times (! PSt+1(0)) +$$
$$g(t+1, 2) \times (! PSt+1(2))$$
$$= (! PSt+2(0) + ! PSt+2(2)) \times (! PSt+1(0)) +$$
$$(! PSt+2(1) + ! PSt+2(3)) \times (! PSt+1(2))$$

Similarly,
g (t, 1)=(!PSt+2 (0)+!PSt+2 (2))×(PSt+1 (0))+(!PSt+2 (1)+!PSt+2 (3))×(PSt+1 (2))
g (t, 2)=(PSt+2 (0)+PSt+2 (2))×(!PSt+1 (1))+(PSt+2 (1)+PSt+2 (3))×(!PSt+1 (3))
g (t, 3)=(PSt+2 (0)+PSt+2 (2))×(PSt+1 (1))+(PSt+2 (1)+PSt+2 (3))×(PSt+1 (3))

These equations indicate that g (t, i) can be found by simple ORs and ANDs of the path select signals PSt+2 at time t+2 and the path select signals PSt+1 at time t+1. The calculation of these equations can be realized by the logical circuit shown in FIG. 7B, which is similar to the internal structure of the partial trace back unit 120 of FIG. 6.

The above-mentioned function g (t, i) indicates whether or not there are any surviving path among the four paths extending from the node i at time t to time t+2. For example, g (t, 1) indicates whether or not there is any surviving path among the four paths extending from node 1 at time t to time t+2 shown in FIG. 7C. When the path extending between the node 0 at time t+1 and the node 0 at time t+2 is a surviving path, the values of the path select signals PSt+1 (0) and PSt+2 (0) become (1, 0). In this case, g (t, 1)=1. Similarly, when any of the other three paths is a surviving path, g (t, 1)=1 is obtained.

As described above, when p=2, there are substantially more non-passing nodes than in the case of p=1, so that more path select signals are converted into the predetermined fixed value than in the case of p=1. As a result, the path memory 104 has more signal value "0"s, thereby further reducing the probability of occurrence of a signal transition. As a result, a reduction in power consumption can be more remarkable.

Generally, tracing back with a length several times as large as the constraint length makes all surviving paths merge together, so that it is preferable that the value of p is at most several times as large as the constraint length. Although an increase in the value of p decreases power consumption in the path memory, it grows the partial trace back unit and the path temporary storage unit in size, thereby increasing their power consumption. Therefore, the realistic value of p is generally 1 to 3.

In the present embodiment, the path select signal corresponding to a non-passing node is converted into a logical value "0". Alternatively, the signal could be converted into a logical value "1" so that the signal values stored in the path memory statistically have more "1"s than "0"s, thereby obtaining the same effects as the present embodiment. In that case, the AND generation means 103a to 103d in the conversion unit 103 could be replaced by OR generation means, and the partial trace back unit 102 could output a logical value "1" for the path select signal corresponding to the non-passing node as the mask signal MSK and logical value "0"s for the other path select signals.

MODIFIED EXAMPLE 1

In the above-mentioned embodiment, the path select signal corresponding to a non-passing node is converted into the predetermined fixed value by the mask signals outputted from the partial trace back unit. Instead, the path select signal corresponding to the non-passing node can be converted into the same value as the one previously stored in the storage region within the path memory where the path select signal is supposed to be written, thereby more directly reducing the occurrence of a signal transition within the path memory.

Figure 8:
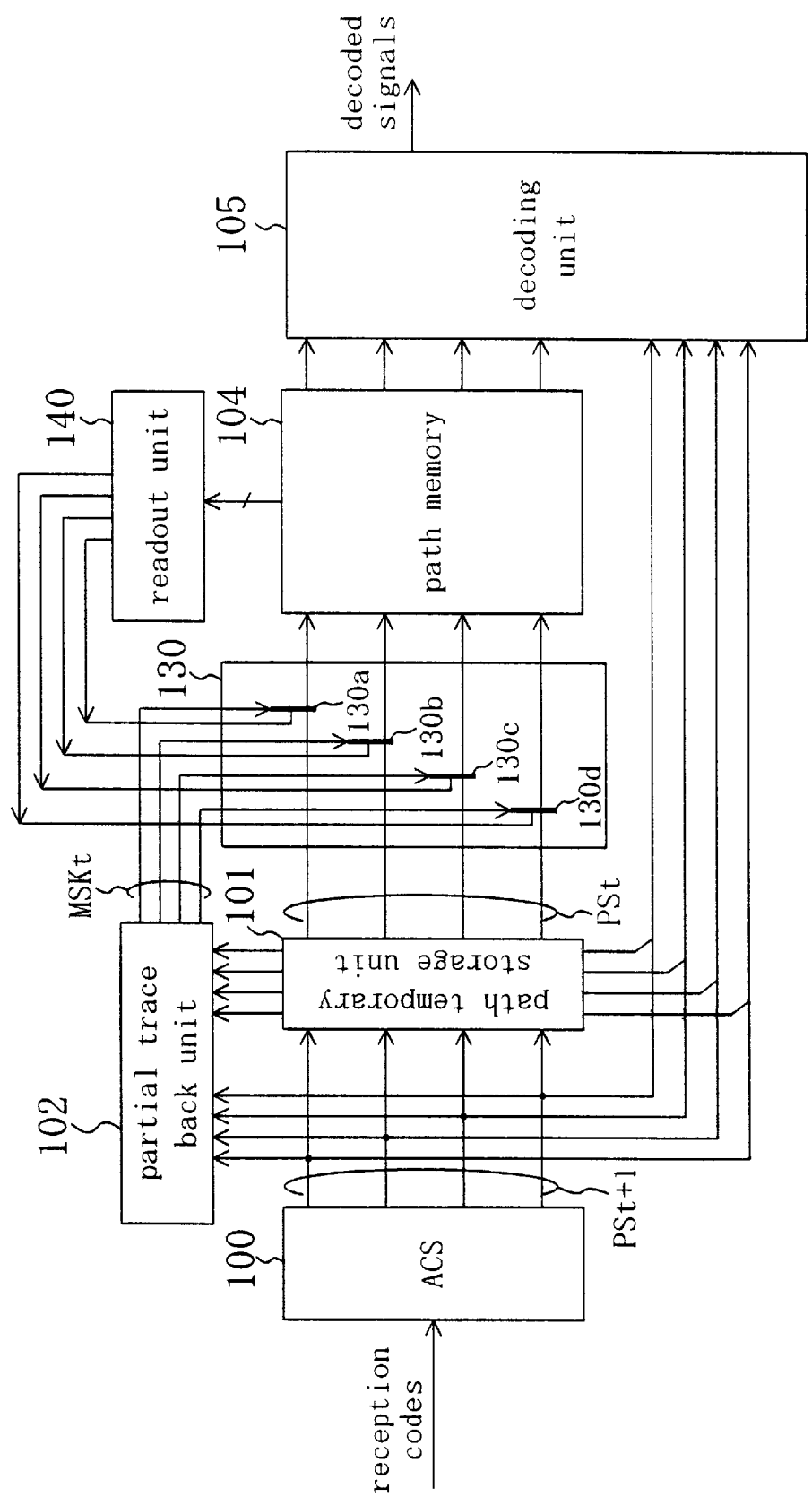
FIG. 8 shows the structure of the viterbi decoder of a modified example of the first embodiment of the present invention.

FIG. 8 shows the structure of the viterbi decoder of the first modified example of the first embodiment. In FIG. 8, a readout unit 140 has a function of reading path select signals already stored in the storage region within the path memory 104 before the path select signals outputted from the conversion unit 130 are written in the storage region. Each selection means 130a to 130d in the conversion unit 130 outputs a path select signal PSt outputted from the path temporary storage unit 101 as it is when the corresponding mask signal MSKt has a bit "1". On the other hand, when the corresponding mask signal MSKt has a bit "0", each selects and outputs the previous path select signal already stored in the storage region where the path select signal outputted from the readout unit 140 is supposed to be written.

The path select signal corresponding to a non-passing node is thus converted into the same value as the one already stored in the storage region within the path memory 104 where the path select signal is supposed to be written, so that storing the converted path select signals does not cause a signal transition within the path memory. As a result, the probability of occurrence of a signal transition in the path memory 104 is reduced, which leads to a decrease in power consumption.

MODIFIED EXAMPLE 2

In the structure shown in FIG. 6, the partial trace back unit 120 finds each of the mask signals MSKt, or g (t, i) from the path select signals PSt+2 and PSt+1 at the same time. However, these path select signals PSt+2 and PSt+1 are generated every input cycle of reception codes, so that executing the calculation of g (t, i) by being divided into a plurality of steps can reduce the amount of calculation per step. As a result, a high-speed decoding operation can be achieved.

Figure 9:
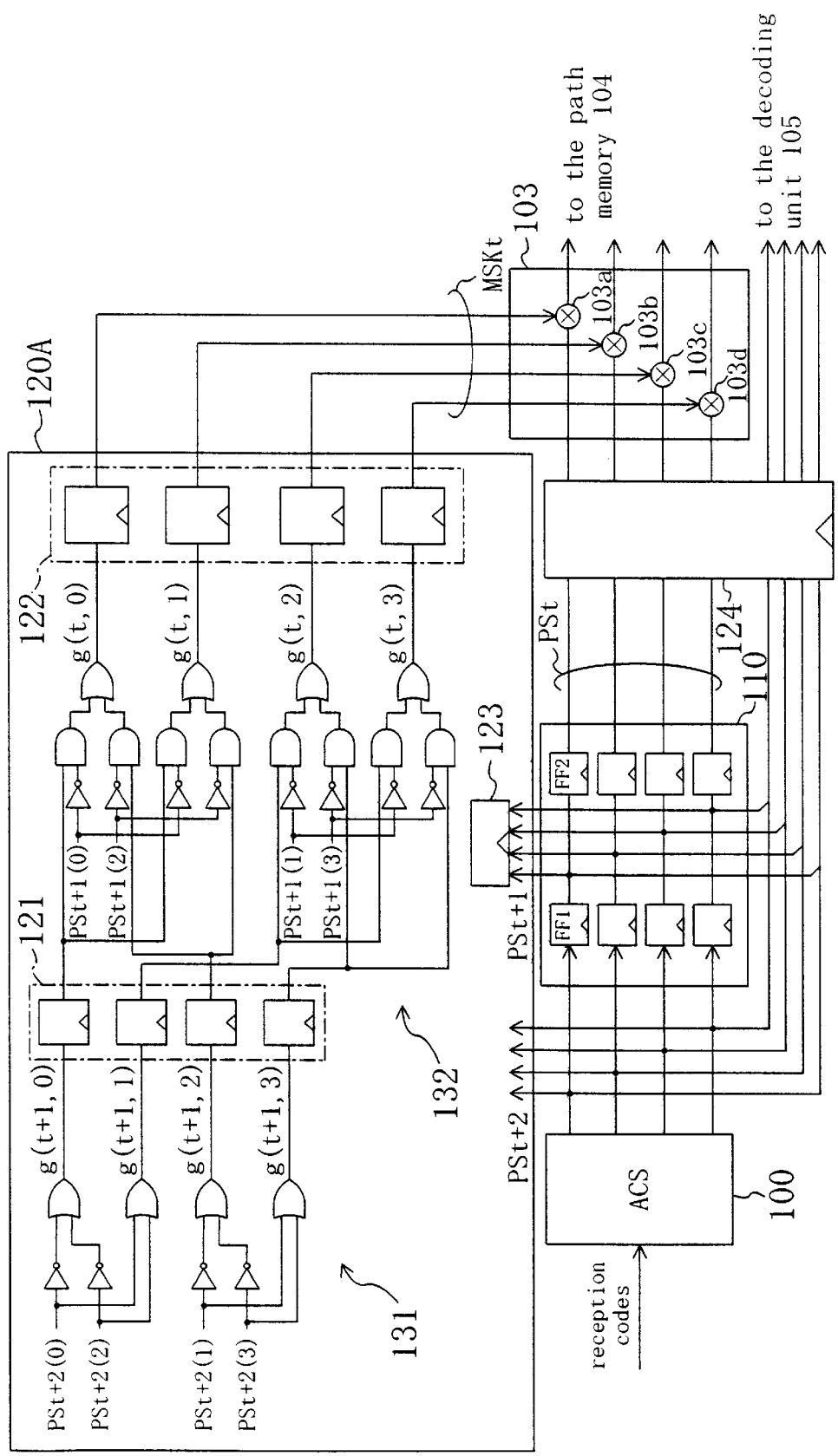
FIG. 9 shows a modified example of the viterbi decoder of FIG. 6 where the partial trace back unit performs pipeline processing.

FIG. 9 shows the structure of the viterbi decoder of the second modified example of the first embodiment. The partial trace back unit 120A in FIG. 9 performs the calculation of g (t, j) by pipeline processing, and differs from the partial trace back unit 120 shown in FIG. 6 in having storage means 121 and 122 for storing g (t+1, i) and g (t, i)(i=0, 1, 2, 3), respectively. The viterbi decoder further comprises delay means 123 and 124 for compensating a delay before the calculation of the mask signals MSKt.

Figure 10:
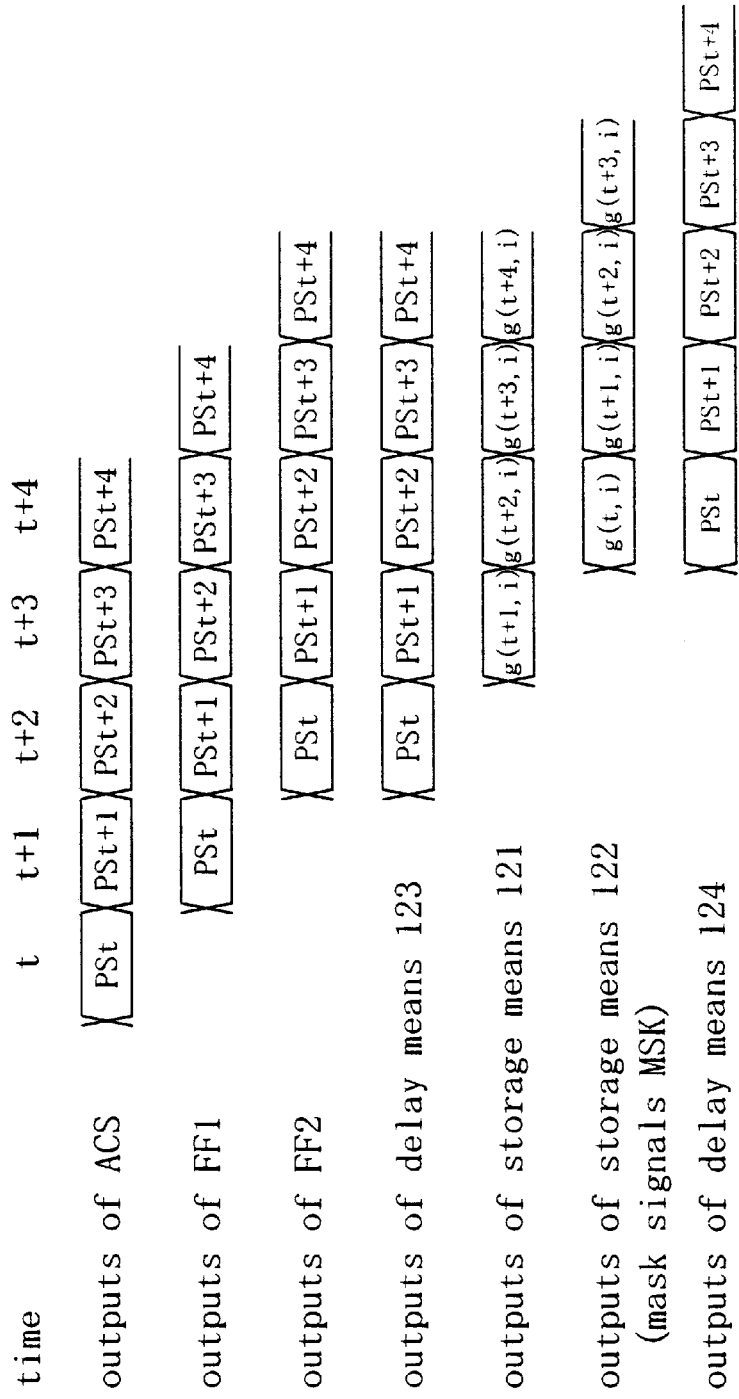
FIG. 10 is a timing chart depicting the behavior of the viterbi decoder of FIG. 9.

As shown in FIG. 10, when the ACS circuit 100 sequentially outputs the path select signals PSt, PSt+1, PSt+2 and so on in accordance with the cycle of the reception codes, the register FF1 of the path temporary storage unit 110 outputs a path select signal delayed by 1 cycle, and the register FF2 outputs a path select signal delayed by 2 cycles. At time t+2, a first calculation unit 131 of the partial trace back unit 120A calculates g (t+1, i) by using the output PSt+2 of the ACS circuit 100 and stores the result in the storage means 121. At time t+3, a second calculation unit 132 of the partial trace back unit 120A calculates g (t, i) by using the output g (t+1, i) of the storage means 121 and the output PSt+1 of the delay means 123, and stores the result in the storage means 122.

At time t+4, the storage means 122 of the partial trace back unit 120A outputs g (t, i) as a mask signal MSK. The delay means 124 delays the outputs PSt of the path temporary storage unit 110 until time t+4. The conversion unit 103 performs the same operation as in the first embodiment to the outputs of the delay means 124 by using the mask signals MSK outputted from the partial trace back unit 120A.

This structure makes the mask signals MSK or g (t, i) be calculated in a span of time corresponding to 2 cycles of the reception codes, thereby realizing a higher-speed calculation than in the structure shown in FIG. 6 where the calculation is performed in 1 cycle. It goes without saying that when p is 3 or larger, pipeline processing can be performed in the same manner as the present modified example.

EMBODIMENT 2

The second embodiment of the present invention achieves the same process as the viterbi decoder of the first embodiment in terms of software.

Figure 11:
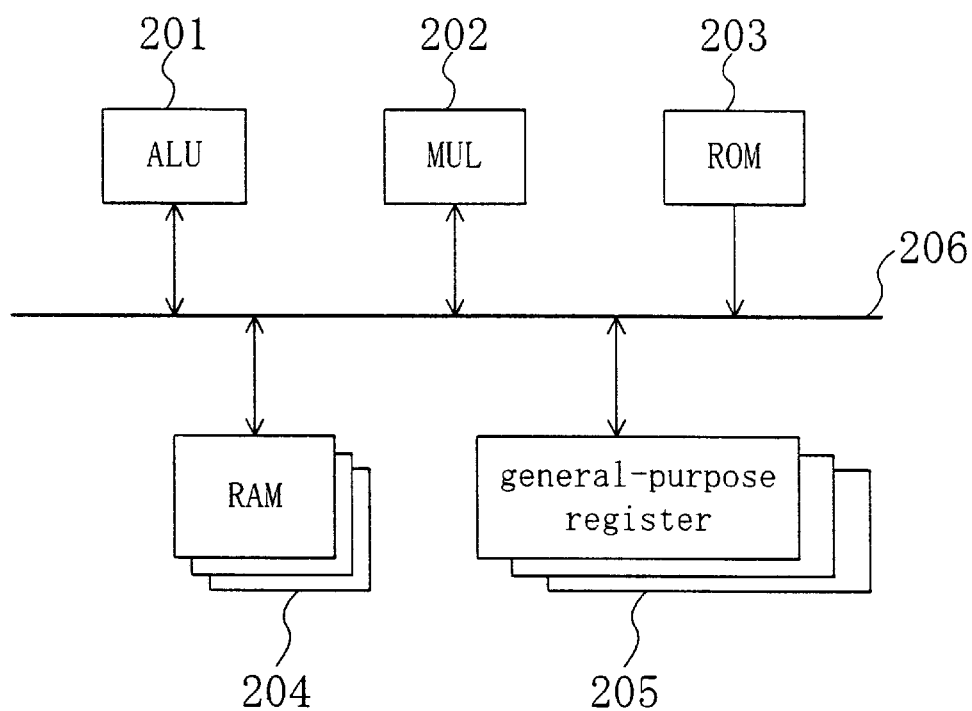
FIG. 11 shows the structure of the viterbi decoder of the second and fourth embodiments of the present invention.

FIG. 11 shows the rough structure of the viterbi decoder of the present embodiment. This decoder comprises an arithmetic logical calculator 201 (ALU), a multiplier 202 (MUL), a ROM 203 for storing, instructions to execute viterbi decoding of the present embodiment, a RAM 204 as path storage means, and a general-purpose register 205. These units 201 to 205 are connected via a bus 206.

Figure 12:
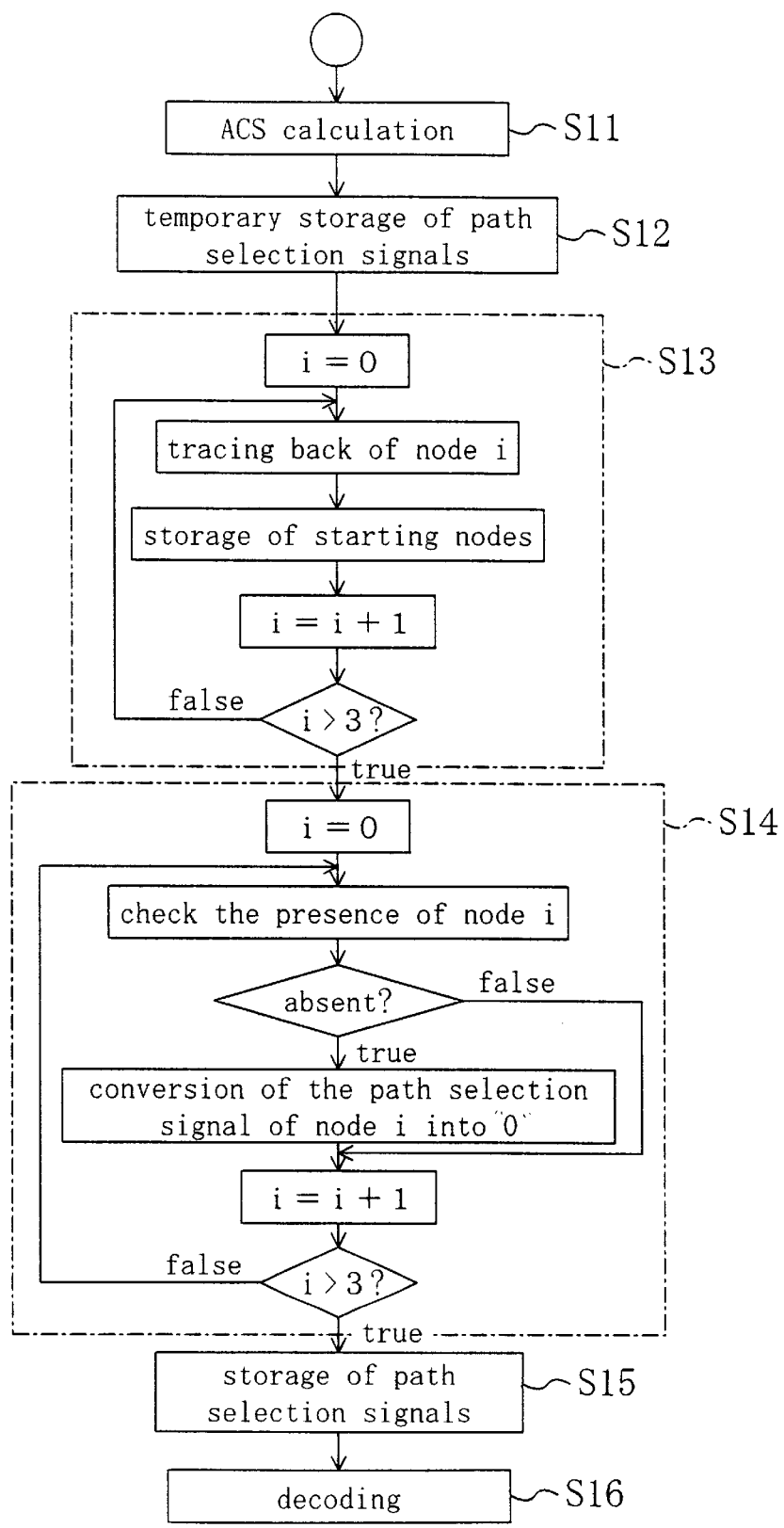
FIG. 12 is a flowchart depicting the viterbi decoding method of the second embodiment of the present invention.

FIG. 12 is a flowchart showing the viterbi decoding method executed in the viterbi decoder shown in FIG. 11. The viterbi decoding method of the present embodiment will be described as follows with reference to FIG. 12. In order to simplify the explanation, the following description will show the case where the encoding rate is ½, the constraint length K=3, and p=1.

As shown in FIG. 12, at Step S11, each branch metric is generated from reception signals stored in the RAM 204, and paths are selected so as to generate path select signals. These calculations are performed by the ALU 201 and the MUL 202. At Step S12, the path select signals are temporary stored in the general-purpose register 205.

Then, Step S13 is executed. First, variable i is initialized to "0", and then the paths of a node i are traced back so as to store the numbers of the passing nodes at one time point earlier as starting nodes in the general-purpose register 205. After adding "1" to the variable i, tracing back and storing of the starting nodes are performed in the same manner. When i>3, Step S13 is terminated. As a result, the starting nodes of the paths at all the nodes 0, 1, 2 and 3 are stored in the general-purpose register 205.

Then, Step S14 is executed. After initializing the variable i to "0", it is checked whether the node number i exists in the numbers of the starting nodes detected and stored in the general-purpose register 205 at Step S13. When the number does not exist, the bit of the path select signal at the time point corresponding to the node i stored in the general-purpose register 205 is converted into "0". After this, "1" is added to the variable i to perform the same process. When i>3, Step S14 is terminated. Thus, all the nodes have been checked whether they are non-passing nodes or not, and the path select signal corresponding to a non-passing node is converted into the fixed value "0".

At Step S15, the path select signals converted at Step S14 are stored in the RAM 204. At Step S16, the most probable surviving path is traced back for the truncation length to obtain a decoded signal. The series of steps are executed by an execution program stored in the ROM 203.

As described hereinbefore, according to the present embodiment, the path select signals which do not affect the decoding process at Step S16 are converted into the fixed value "0"s at Step S14. Consequently, the logical values of the path select signals stored in the RAM 204 statistically have more "0"s than "1"s, thereby making the probability of occurrence of a signal transition in the RAM 204 lower than ½. As a result, power consumption in the RAM 204 can be reduced without deteriorating decoding performance at all.

The present embodiment describes about the case where the encoding rate is ½, K=3, and p=1; however, the same effects can be obtained in the case where the partial trellis is extended from between 2 states to between $2^m$ states when the encoding rate is m/n (n and m are positive integers). In addition, the similar effects can be obtained when p is 2 or larger as described in the first embodiment.

In the present embodiment, the path select signal corresponding to a non-passing node is converted into a logical value "0". Instead, when the signal is converted into a logical value "1", the signal values stored in the RAM statistically have more "1"s than "0"s, thereby achieving the same effects as in the present embodiment.

EMBODIMENT 3

Figure 13:
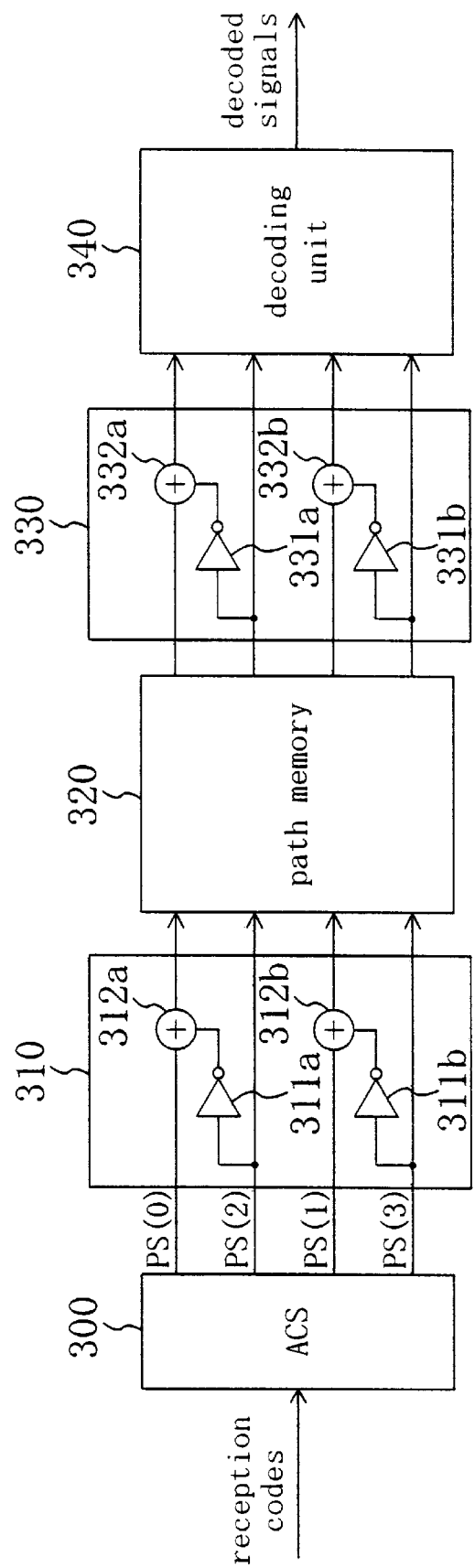
FIG. 13 shows the structure of the viterbi decoder of the third embodiment of the present invention.

FIG. 13 shows the rough structure of the viterbi decoder of the third embodiment of the present invention. In order to simplify the explanation, the following description will show the case where the encoding rate is ½ and the constraint length K=3.

The viterbi decoder shown in FIG. 13 comprises an ACS circuit as ACS means for generating path select signals from the reception codes, a conversion unit 310 which applies predetermined conversion to path select signals outputted from the ACS circuit 300, a path memory as path storage means for storing the converted path select signals outputted from the conversion unit 310, a reverse conversion unit 330 which converts the path select signals outputted from the path memory 320 reverse to the predetermined conversion in the conversion unit 310, and a decoding unit 340 which performs decoding by using the reversely-converted path select signals outputted from the reverse conversion unit 330.

The ACS circuit 300 outputs "0"s when it selects the transition from the node 2*s0 at time t, and outputs "1"s when it selects the transition from the node 2*s0+1 as the path select signals for the nodes so and s0+2 (s0 is either 0 or 1) at time t+1.

The conversion unit 310, to be more specific, comprises logical inverse means 311a and 311b for generating the logical inverse of the path select signals for the node s0+2, and XOR generation means 312a and 312b for generating the exclusive OR of the output of each of the logical inverse means 311a and 311b, respectively, and the respective path select signal for the node s0. The reverse conversion unit 330, similar to the conversion unit 310, comprises logical inverse means 331a and 331b for generating the logical inverse of the path select signals for the node s0+2, and XOR generation means 332a and 332b for generating the exclusive OR of the output of each of the logical inverse means 331a and 331b, respectively, and the respective path select signal for the node s0.

The behavior of the viterbi decoder thus structured will be described as follows with reference to FIGS. 14A to 14D.

There are four possible combinations of path select signals indicating the surviving paths between the states 2*s0 and 2*s0+1 at time t and the states s0 and s0+2 at time t+1 of the trellis diagram as shown in FIGS. 14A to 14D. In FIGS. 14A to 14D, the path select signals PSt+1 for the states s0 and s0+2 at time t+1 are (0, 0), (1, 1), (0, 1) and (1, 0), respectively.

Figures 14A, 14B, 14C, 14D:
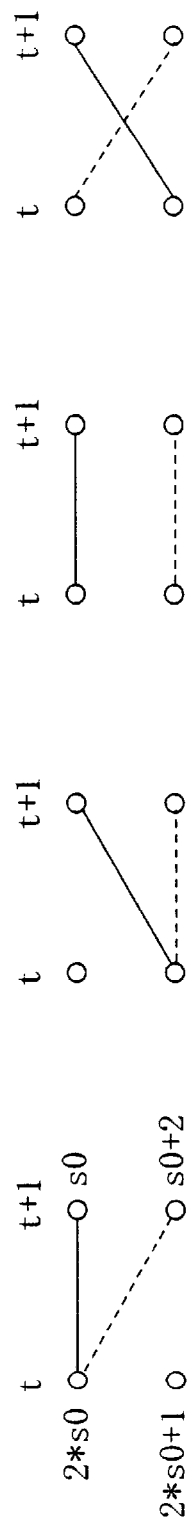
FIGS. 14A to 14D are diagrams explaining the behavior of the viterbi decoder of FIG. 13, and respectively show the surviving paths and the combinations of path select signals in the partial trellis between time t and time t+1.

Of these combinations of the path select signals shown in FIGS. 14A to 14D, the cases of FIGS. 14A and 14B where the surviving paths merge with each other statistically occur less frequently than the cases of FIGS. 14C and 14D where the surviving paths do not merge. In short, precision decoding requires a sufficiently long trace back length. From this, it can be inferred that the merging of paths does not occur so frequently and that the probability of merging of paths at each time point is lower than the probability of not merging. This agrees with the empirical findings of the inventors of the present invention through research and development.

Therefore, in the present embodiment, conversion of path select signals is so performed that the combinations of the path select signals shown in FIGS. 14C and 14D as the first combination having a relatively high frequency of occurrence have more logical value "0"s than the combinations of the path select signals shown in FIGS.14A and 14B as the second combination having a relatively low frequency of occurrence.

To be more specific, the conversion unit 310 converts the path select signal (1, 0) of FIG. 14D into (0, 0), and also converts the path select signal (0, 0) of FIG. 14A into (1, 0). The path select signals outputted from the conversion unit 310 are stored in the path memory 320. The reverse conversion unit 330 converts the path select signals (0, 0) and (1, 0) outputted from the path memory 320 into (1, 0) and (0, 0), respectively, reverse to the conversion in the conversion unit 310.

Through the above-described structure and behavior, the signal values of the path select signals stored in the path memory 320 statistically have more "0"s than "1"s, making the probability of occurrence of a signal transition in the memory cell or memory output of the path memory 320 lower than ½. As a result, power consumption in the path memory 320 can be reduced, thereby realizing a viterbi decoder operative with low power consumption.

As add-on circuits, only the conversion unit 310 composed of simple logical gates and the reverse conversion unit 330 are required, so that the circuit size can be remarkably reduced compared with the conventional structure. Consequently, the conversion in the conversion unit 310 and the reverse conversion in the reverse conversion unit 330 become the same process, which makes the conversion unit 310 and the reverse conversion unit 330 be realized in the same structure.

EMBODIMENT 4

The fourth embodiment of the present invention achieves the same process as the viterbi decoding of the third embodiment in terms of software.

Figure 15:
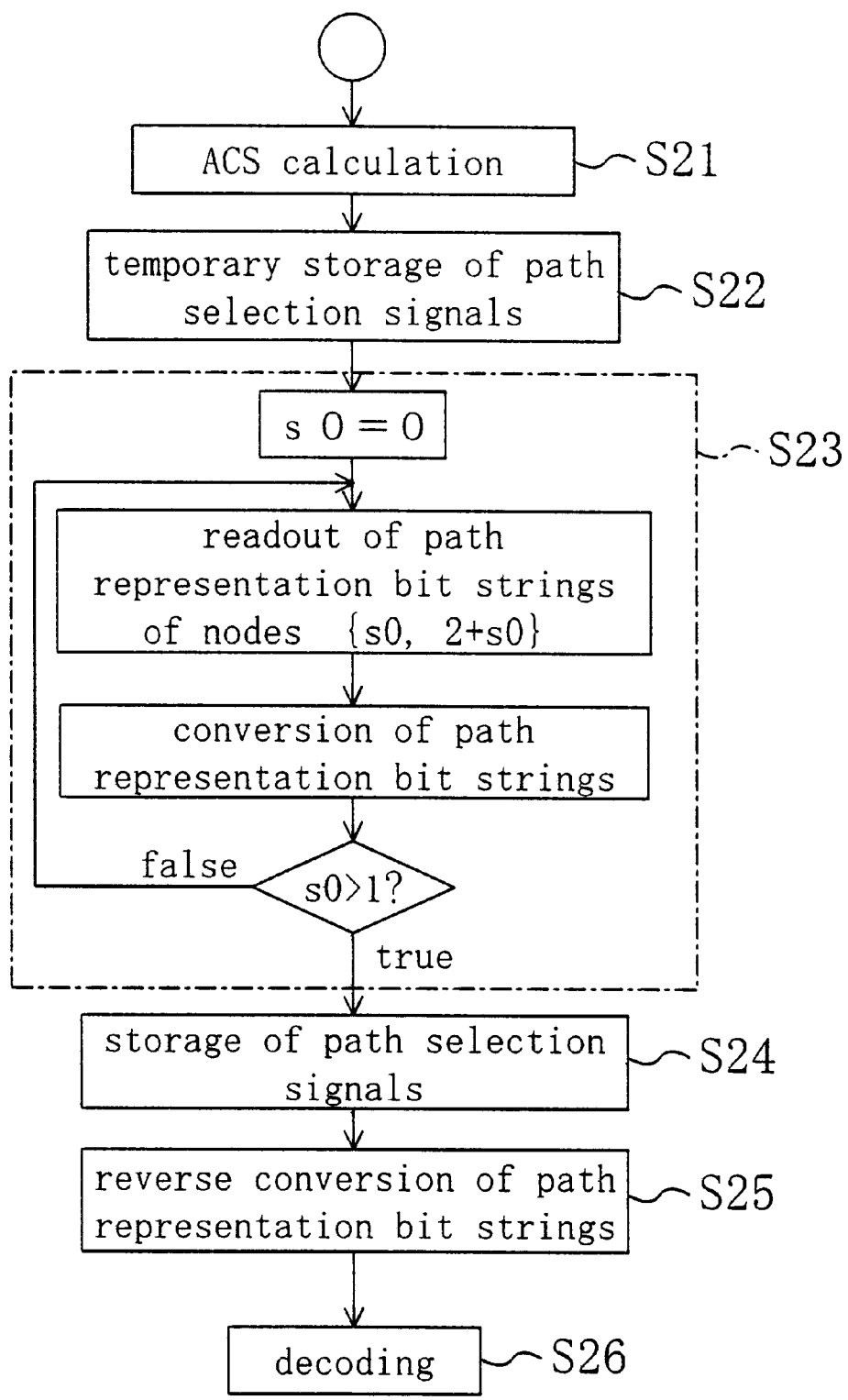
FIG. 15 is a flowchart depicting the viterbi decoding method of the fourth embodiment of the present invention.
Figure 16:
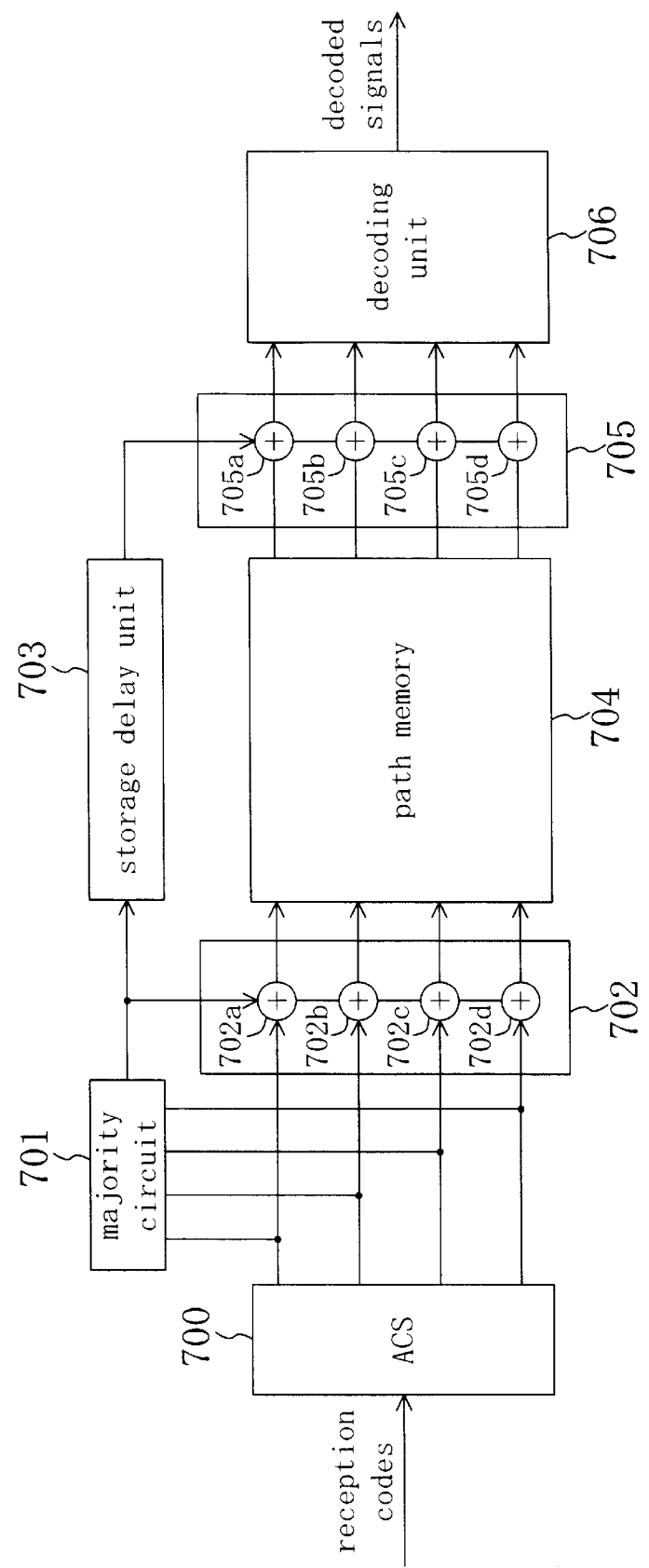
FIG. 16 shows the structure of a conventional viterbi decoder.

FIG. 15 is a flowchart showing the viterbi decoding method of the present embodiment. The viterbi decoding method of the present embodiment is executed by the above-described viterbi decoder shown in FIG. 11. In order to simplify the explanation, the following description will show the case where the encoding rate is ½ and the constraint length K=3.

As shown in FIG. 15, at Step S21, each branch metric is generated from the reception signals stored in the RAM 204, and paths are selected so as to generate path select signals. These calculations are performed by the ALU 201 and the MUL 202. At Step S22, the path select signals are temporary stored in the general-purpose register 205.

Then, Step S23 is executed. First, variable s0 is initialized to "0", and then 2-bit path representation bit strings which are path select signals to represent surviving paths of nodes {s0, s0+2} are read from the path select signals stored in the general-purpose register 205. The read path representation bit strings are subjected to the same predetermined conversion as in the third embodiment. For example, {0, 1}, {1, 0}, {0, 0} and {1, 1} are converted into {0, 1}, (0, 0), (1, 0) and (1, 1), respectively. Then, the same process is executed by setting the variable s0 at "1" so as to terminate Step S23. At Step S24, the converted path select signals are stored in the RAM 204 as the path storage means.

At Step S25, the path select signals read from the RAM 204 are subjected to conversion reverse to the predetermined conversion of Step S23. To be more specific, of the converted bit strings that have been read, {0, 1}, {0, 0}, {1, 0} and {1, 1} are converted into {0, 1}, {1, 0}, {0, 0} and (1, 1), respectively. At Step S26, tracing back is performed by using the reversely-converted path select signals so as to obtain decoded signals.

In the same manner as in the third embodiment, conversion of path select signals is so performed that the combinations of path select signals shown in FIGS. 14C and 14D having a fewer number of merges and a relatively high frequency of occurrence have more logical value "0"s than the combinations of path select signals shown in FIGS. 14A and 14B having a larger number of merges and a relatively low frequency of occurrence. Consequently, the logical values of the path select signals stored in the RAM 204 statistically have more "0"s than "1"s, making the probability of occurrence of a signal transition in the RAM 204 lower than ½. As a result, power consumption in the RAM 204 can be reduced, thereby realizing a viterbi decoder operative with low power consumption.

The conversion method shown in the third and fourth embodiments is one example, and other methods could be used as long as the combinations of path select signals having a relatively high frequency of occurrence have more logical value "0"s than the combinations of path select signals having a relatively low frequency of occurrence.

The third and fourth embodiments describe the case where the encoding rate is ½ and the constraint length K=3; however, in general, in the case where the encoding rate is m/n, when the number of states contained in the predetermined portion of the trellis diagram is x, the number of bits of the path select signals representing this predetermined portion becomes (m*x). The larger number of paths out of the x surviving paths merge, or the more paths merges with each other, the lower the frequency of occurrence of the combinations becomes. Therefore, it goes without saying that by performing conversion in such a manner that the combinations of path select signals with a higher frequency of occurrence have more logical value "0"s, the same effects as the third and fourth embodiments can be obtained.

In the third and fourth embodiments, conversion is so performed that the combinations of path select signals with a high frequency of occurrence have more logical value "0"s; however, instead, more logical value "1"s can be contained so as to obtain the same effects as the present embodiment.

The other causes than the number of merges of surviving paths may cause a difference in the frequency of occurrence of the combinations of path select signals, and the present invention can be applied to theses cases.

For example, in the case of convolutional encoder, if input is random, the frequency of appearance of each state transition is statistically even. On the other hand, when the input has certain statistics (in the case where outer coding is performed to make either "0" or "1" consecutive over a certain period of time, for example), the frequency of appearance of each state transition is not statistically even. In that case, similar to the third and fourth embodiments, conversion of path select signals is so performed that a specific logical value outnumbers the other logical value in the combinations of path select signals statistically having a high frequency of occurrence. This decreases the probability of occurrence of a signal transition in the path storage means.

As described hereinbefore, according to the present invention, the path select signal which corresponds to a non-passing node and is never referred to in tracing back for decoding is converted in such a manner as to decrease the probability of occurrence of a signal transition in the path storage means, thereby reducing power consumption.

Moreover, in the present invention, conversion of path select signals is so performed that the combinations of path select signals with a relatively high frequency of occurrence have a larger number of a predetermined fixed value which is one of the signal values of the path select signals. As a result, the path storage means statistically has a larger number of the signal value corresponding to this predetermined fixed value. This decreases the probability of occurrence of a signal transition in the path storage means than in the case where no conversion is performed, thereby reducing power consumption.

What is claimed is:

1. A viterbi decoder which has path storage means for storing path select signals and which performs decoding by using said path storage means, said viterbi decoder performing the steps of:

partially tracing back path select signals outputted from ACS means between a first time point and a second time point, thereby finding surviving paths reaching each node at the first time point;

detecting a non-passing node through which said surviving paths do not pass, of nodes at the second time point;

converting a path select signal corresponding to said non-passing node at the second time point in such a manner as to decrease a probability of occurrence of a signal transition in said path storage means; and storing path select signals corresponding to said nodes at the second time point to said path storage means.

2. The viterbi decoder of claim 1, wherein said path select signal corresponding to said non-passing node is converted into a predetermined fixed value which is one of signal values of said path select signal.

3. The viterbi decoder of claim 1, wherein said path select signal corresponding to said non-passing node is converted into a same value as a value already stored in a storage region in said path storage means where said path select signal to be converted is supposed to be written.

4. A viterbi decoder which has path storage means for storing path select signals and which performs decoding by using said path storage means, said viterbi decoder comprising:

a path temporary storage unit for storing path select signals outputted from ACS means over a certain period of time and then outputting said path select signals;

a partial trace back unit for tracing back surviving paths reaching each node at time t+p by using path select signals between time t and time t+p−1 where p is a natural number which are stored in said path temporary storage unit and path select signals at time t+p outputted from said ACS means so as to detect a non-passing node through which said surviving paths do not pass; and a conversion unit for inputting path select signals at time t outputted from said path temporary storage unit, and receiving signals from said partial trace back unit so as to convert a path select signal corresponding to said non-passing node out of said path select signals at time t into a predetermined fixed value which is one of signal values of said path select signal, said path storage means storing path select signals at time t outputted from said conversion unit.

5. A viterbi decoder which has path storage means for storing path select signals and which perform decoding by using said path storage means, said viterbi decoder comprising:

a path temporary storage unit for storing path select signals outputted from ACS means over a certain period of time and then outputting said path select signals;

a partial trace back unit for tracing back surviving paths reaching each node at time t+p by using path select signals between time t and time t+p−1 where p is a natural number which are stored in said path temporary storage unit and path select signals at time t+p outputted from said ACS means so as to detect a non-passing node through which said surviving paths do not pass;

readout means for reading out storage contents in a storage region in said path storage means where path select signals at time t are supposed to be written; and a conversion unit for inputting path select signals at time t outputted from said path temporary storage unit and said storage contents outputted from said readout means and receiving signals from said partial trace back unit so as to convert a path select signal corresponding to said non-passing node out of said path select signals at time t into a same value as a value which is contained in said storage contents and stored in a storage region where said path select signal to be converted is supposed to be written, said path storage means storing path select signals at time t outputted from said conversion unit.

6. The viterbi decoder of claim 4 or 5, wherein said partial trace back unit finds a function g (t, j) concerning each node j at time t, and determines that node j is a non-passing node when g (t, j)=0, where g (t, i) is a function for calculating g (r, i)=Σ{g (r+1, n (i))×f (r, n (i))} from r=t+p−1 until r=t in sequence by using g (t+p, k)=1 as an initial value where k is an any node number, where n (i): transition target nodes at time r+1 of a node i at time r;

f (r, n (i)): a function which indicates whether or not surviving paths reaching nodes n (i) at time r+1 pass through node i at time r, and which becomes "1" when said surviving paths pass through said nodes i, "0" otherwise;

Σ{ }: an OR of all said nodes n (i); and

X: AND.

7. The viterbi decoder of claim 6, wherein said partial trace back unit comprises a plurality of storage means for storing each value of g (r, i) at time r, and performs calculation of said function g (t, j) by pipeline processing.

8. A viterbi decoding method for performing decoding by using path storage means for storing path select signals, said viterbi decoding method comprising the steps of:

partially tracing back path select signals outputted from ACS means between a first time point and a second time point, thereby finding surviving paths reaching each node at the first time point;

detecting a non-passing node through which said surviving paths do not pass, of nodes at the second time point;

converting a path select signal corresponding to said non-passing node at the second time point in such a manner as to decrease a probability of occurrence of a signal transition in said path storage means; and storing path select signals corresponding to said nodes at the second time point to said path storage means.

9. The viterbi decoding method of claim 8, wherein said path select signal corresponding to said non-passing node is converted into a predetermined fixed value which is one of signal values of said path select signal.

10. The viterbi decoding method of claim 8, wherein said path select signal corresponding to said non-passing node is converted into a same value as a value already stored in a storage region in said path storage means where said path select signal to be converted is supposed to be written.

11. A viterbi decoder which has path storage means for storing path select signals and which performs decoding by using said path storage means, said viterbi decoder performing the steps of:

applying predetermined conversion to path select signals outputted from ACS means;

storing converted path select signals in said path storage means;

applying conversion reverse to said predetermined conversion to path select signals outputted from said path storage means; and performing decoding by using reversely-converted path select signals, said predetermined conversion being so conducted that, out of combinations of path select signals representing surviving paths in a predetermined portion in a trellis diagram, a first combination with a relatively high frequency of occurrence contains a predetermined fixed value which is one of signal values of said path select signals more than a second combination with a relatively low frequency of occurrence.

12. The viterbi decoder of claim 11, wherein said predetermined conversion is performed by using a combination of path select signals with a relatively few number of merges of surviving paths as the first combination, and a combination of path select signals with a relatively large number of merges of surviving paths as the second combination.

13. A viterbi decoder comprising:

a conversion unit for applying predetermined conversion to path select signals outputted from ACS means;

path storage means for storing path select signals outputted from said conversion unit;

reverse conversion unit for applying conversion reverse to said predetermined conversion in said conversion unit to path select signals outputted from said path storage means; and a decoding unit for performing decoding by using path select signals outputted from said reverse conversion unit, said conversion unit so performing conversion that, out of combinations of path select signals representing surviving paths in a predetermined portion in a trellis diagram, a first combination with a relatively few number of merges of surviving paths has a predetermined fixed value which is one of signal values of path select signals more than a second combination with a relatively large number of merges of surviving paths.

14. The viterbi decoder of claim 13, wherein said ACS means outputs "0" when a transition from a node $2*s0+0$ at time t is selected, and outputs "1" when a transition from a node $2*s0+1$ at time t is selected as a path select signal for a node $s0+i0*2^{(K-2)}$ at time t+1 where $s0<2^{(K-2)}$, s0 is either "0" or a positive integer, and i0=0, 1; and said conversion unit outputs an exclusive OR of PS (i0=0) and a logical inverse signal of PS (i0=1) regarding a path select signal PS for node $s0+i0*2^{(K-2)}$ at time t+1 as a new path select signal PS (i0=0).

15. A viterbi decoding method for performing decoding by using path storage means which stores path select signals, said viterbi decoding method comprising the steps of:

applying predetermined conversion to path select signals outputted from ACS means;

storing converted path select signals in said path storage means;

applying conversion reverse to said predetermined conversion to path select signals outputted from said path storage means; and performing decoding by using reversely-converted path select signals, said predetermined conversion being so conducted that, out of combinations of path select signals representing surviving paths in a predetermined portion in a trellis diagram, a first combination with a relatively high frequency of occurrence contains a predetermined fixed value which is one of signal values of said path select signals more than a second combination with a relatively low frequency of occurrence.

16. The viterbi decoding method of claim 15, wherein said predetermined conversion is performed by using a combination of path select signals with a relatively few number of merges of surviving paths as the first combination, and a combination of path select signals with a relatively large number of merges of surviving paths as the second combination.

17. The viterbi decoding method of claim 16, wherein said ACS means outputs "0" when a transition from a node $2*s0+0$ at time t is selected, and outputs "1" when a transition from a node $2*s0+1$ at time t is selected as a path select signal for a node $s0+i0*2^{(K-2)}$ at time t+1 where $s0<2^{(K-2)}$, s0 is either 0 or a positive integer, and i0=0, 1; and in said predetermined conversion, as for path select signals {PS (i0=0), PS (i0=1)} for node $s0+i0*2^{(K-2)}$ at time t+1, a) {0, 1} is converted to {0, 1}
b) {1, 0} is converted to {0, 0}
c) {0, 0} is converted to {1, 0}
d) {1, 1} is converted to {1, 1}.

* * * * *

UNITED STATES PATENT AND TRADEMARK OFFICE
CERTIFICATE OF CORRECTION

PATENT NO.     : 6,647,530 B1                                              Page 1 of 1
DATED          : November 11, 2003
INVENTOR(S)    : Takehiro Kamada It is certified that error appears in the above-identified patent and that said Letters Patent is hereby corrected as shown below:

<u>Title page,</u>
Item [56], References Cited, FOREIGN PATENT DOCUMENTS,
insert -- JP 2996615 12/12/2000 --

Signed and Sealed this

Fifteenth Day of June, 2004

JON W. DUDAS
*Acting Director of the United States Patent and Trademark Office*